United States Patent
Nagorny et al.

(10) Patent No.: US 12,272,521 B2
(45) Date of Patent: Apr. 8, 2025

(54) PLASMA SOURCES AND PLASMA PROCESSING APPARATUS THEREOF

(71) Applicant: Applied Materials, Inc., Santa Clara, CA (US)

(72) Inventors: Vladimir Nagorny, Tracy, CA (US); Wei Liu, San Jose, CA (US); Rene George, San Carlos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/199,780

(22) Filed: May 19, 2023

(65) Prior Publication Data

US 2023/0369017 A1 Nov. 16, 2023

Related U.S. Application Data

(63) Continuation of application No. 17/149,254, filed on Jan. 14, 2021, now Pat. No. 11,658,006.

(51) Int. Cl.
*H01J 37/32* (2006.01)

(52) U.S. Cl.
CPC ....... *H01J 37/3211* (2013.01); *H01J 37/3244* (2013.01); *H01J 2237/332* (2013.01)

(58) Field of Classification Search
CPC ........... H01J 32/32422; H01J 32/32449; H01J 32/32357; H01J 32/32715; H01J 32/32642; H01J 32/32458
See application file for complete search history.

(56) References Cited

U.S. PATENT DOCUMENTS

| 3,755,710 A | 8/1973 | Osborn, Jr. |
| 6,770,165 B2 | 8/2004 | Obuchi |

(Continued)

FOREIGN PATENT DOCUMENTS

| EP | 0064288 A1 | 11/1982 |
| JP | 2015/227282 A | 12/2015 |

(Continued)

OTHER PUBLICATIONS

International Search Report and Written Opinion dated Apr. 12, 2022 for Application No. PCT/US2021/063652.

(Continued)

*Primary Examiner* — Tung X Le
(74) *Attorney, Agent, or Firm* — Patterson + Sheridan, LLP

(57) ABSTRACT

Embodiments of the present disclosure generally relate to inductively coupled plasma sources and plasma processing apparatus. In at least one embodiment, plasma source includes a first sidewall and a gas injection insert defining a plasma source interior volume. The gas injection insert includes a peripheral gas injection port, a second sidewall disposed concentric with the first sidewall, and a center gas injection port. The plasma source includes a first induction coil disposed proximate the first sidewall and disposed around the first sidewall. The plasma source includes a first radio frequency power generator coupled with the first induction coil. The plasma source includes a second induction coil disposed proximate the second sidewall and disposed around the second sidewall. The plasma source includes a second radio frequency power generator coupled with the second induction coil.

16 Claims, 7 Drawing Sheets

(56) References Cited

U.S. PATENT DOCUMENTS

| | | | |
|---|---|---|---|
| 6,794,301 B2* | 9/2004 | Savas | H01J 37/32706 216/68 |
| 8,916,022 B1 | 12/2014 | Caron | |
| 9,214,319 B2 | 12/2015 | Nagorny et al. | |
| 10,504,744 B1* | 12/2019 | Yanagawa | H01L 21/31116 |
| 11,658,006 B2 | 5/2023 | Nagorny et al. | |
| 12,002,652 B2* | 6/2024 | Savas | H01J 37/32183 |
| 2004/0031564 A1 | 2/2004 | Gottscho et al. | |
| 2006/0019039 A1 | 1/2006 | Hanawa et al. | |
| 2006/0091109 A1 | 5/2006 | Partlo et al. | |
| 2007/0037397 A1 | 2/2007 | Lu et al. | |
| 2007/0194245 A1 | 8/2007 | Yevtukhov et al. | |
| 2011/0014397 A1 | 1/2011 | Yang | |
| 2012/0152901 A1* | 6/2012 | Nagorny | H01J 37/32715 216/68 |
| 2013/0284370 A1 | 10/2013 | Collins et al. | |
| 2014/0197136 A1 | 7/2014 | Nagorny et al. | |
| 2015/0126035 A1 | 5/2015 | Diao et al. | |
| 2017/0243721 A1 | 8/2017 | Nagorny et al. | |
| 2017/0372870 A1 | 12/2017 | Godyak et al. | |
| 2018/0358204 A1 | 12/2018 | Ma et al. | |
| 2018/0358206 A1* | 12/2018 | Ma | B08B 5/00 |
| 2019/0131112 A1 | 5/2019 | Ma et al. | |
| 2019/0198301 A1 | 6/2019 | Ma et al. | |
| 2021/0050213 A1 | 2/2021 | Savas et al. | |
| 2021/0074558 A1* | 3/2021 | Nam | H01J 37/32715 |
| 2022/0068611 A1 | 3/2022 | Long et al. | |
| 2023/0366119 A1* | 11/2023 | Thorkelsson | H01L 21/67028 |

FOREIGN PATENT DOCUMENTS

| | | |
|---|---|---|
| KR | 20140128479 A | 11/2014 |
| WO | 2004/024359 A2 | 3/2004 |
| WO | 2013/028313 A1 | 2/2013 |
| WO | 2015145663 A1 | 10/2015 |

OTHER PUBLICATIONS

Magnetic Field Influence On The Shape Of Eroding Surface Of Graphite Cathodes, I. I. Aksenov, V. V. Vasil'ev, A. O. Omarov, V. E. Strel'nitskij (2002), available at http://dspace.nbuv.gov.ua/bitstream/handle/123456789/79282/46-Aksenov1.pdf?sequence=1.

Validation of High Efficiency ICP Source Performance for Advanced Resist Ashing, V. Nagorny et al., IEEE (2015).

* cited by examiner

PLASMA SOURCES AND PLASMA PROCESSING APPARATUS THEREOF

CROSS-REFERENCE TO RELATED APPLICATIONS

This application is a continuation of U.S. patent application Ser. No. 17/149,254, filed Jan. 14, 2021, which is herein incorporated by reference in its entirety.

BACKGROUND

Field

Embodiments of the present disclosure generally relate to inductively coupled plasma sources and plasma processing apparatus.

Description of the Related Art

Plasma processing is used in the semiconductor industry for deposition, etching, resist removal, and related processing of semiconductor substrates and other substrates. Plasma sources are often used for plasma processing to produce high density plasma and reactive species for processing substrates.

Formation of plasma breaks atoms and molecules into radicals and/or generates ions, which can be used to achieve substrate treatment in a chamber. Typically, a mixture of gases is fed into a plasma generation region (active zone) of an inductively coupled plasma (ICP) source, and electrons accelerated in the high electric field region ionize and dissociate this mixture, creating a new gas (plasma) having radicals and ions.

ICP sources for high plasma generation efficiency and wide operational range have a relatively small active zone adjacent to an ICP coil. Such active zones are designed to provide electron confinement in this zone around the coil and thus the heating rate of electrons is confined in that zone, forming the plasma. However, as the plasma species move toward the substrate, some chemical reactions occur between the species in the plasma volume and on the surface, reducing the number of radicals, but creating a number of new species as a result. Accordingly, conventional ICP sources may not provide adequate uniformity control and efficient delivery of species (generated in the active zones) to the substrate.

In addition, for processing of substrates, unconventional chemical species in large numbers, or an unusual combination of species, may be desired, and these unconventional combinations cannot be obtained by known ICP sources.

Therefore, there is a need for improved inductively coupled plasma sources and plasma processing apparatus.

SUMMARY

Embodiments of the present disclosure generally relate to inductively coupled plasma sources and plasma processing apparatus.

In at least one embodiment, plasma source includes a first sidewall and a gas injection insert defining a plasma source interior volume. The gas injection insert includes a peripheral gas injection port, a second sidewall disposed concentric with the first sidewall, and a center gas injection port. The plasma source includes a first induction coil disposed proximate the first sidewall and disposed around the first sidewall. The plasma source includes a first radio frequency power generator coupled with the first induction coil. The plasma source includes a second induction coil disposed proximate the second sidewall and disposed around the second sidewall. The plasma source includes a second radio frequency power generator coupled with the second induction coil.

In at least one embodiment, a plasma source includes a sidewall and a gas injection insert defining a plasma source interior volume. The gas injection insert includes a peripheral gas injection port. The plasma source includes the gas injection insert disposed within the plasma source interior volume, the gas injection insert defining a gas injection channel proximate the sidewall. The plasma source includes a center gas injection port disposed through the gas injection insert to provide an opening at a portion of the gas injection insert. The plasma source includes a platform coupled with the gas injection insert and disposed proximate the opening.

In at least one embodiments, a plasma source includes a first sidewall and a gas injection insert defining a plasma source interior volume. The gas injection insert includes a peripheral gas injection port, a second sidewall, and a center gas injection port. The center gas injection port is proximate the second sidewall and is disposed around the second sidewall.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to high efficiency inductively coupled plasma sources and plasma processing apparatus. Sources and apparatus of the present disclosure can provide improved plasma uniformity for processing substrates in addition to efficient delivery of high density neutral plasma species (e.g., unconventional species) to the substrates. It is conventionally assumed that more efficient generation of species in the active zones of a plasma source automatically results in more of those species near the wafer, but the inventors have noticed that this is an untrue (at least incomplete) assumption. In addition, plasma sources and apparatus of the present disclosure can provide a high density of molecules that normally one cannot obtain in a plasma discharge (or their density is very small), which can be advantageous for wafer processing.

Aspects of the present disclosure are discussed with reference to a "substrate" or semiconductor wafer for purposes of illustration and discussion. Those of ordinary skill in the art, using the disclosures provided herein, will understand that the example aspects of the present disclosure can be used in association with any suitable semiconductor substrate or other suitable substrate. A "substrate support" refers to any structure that can be used to support a substrate.

Figure 1:
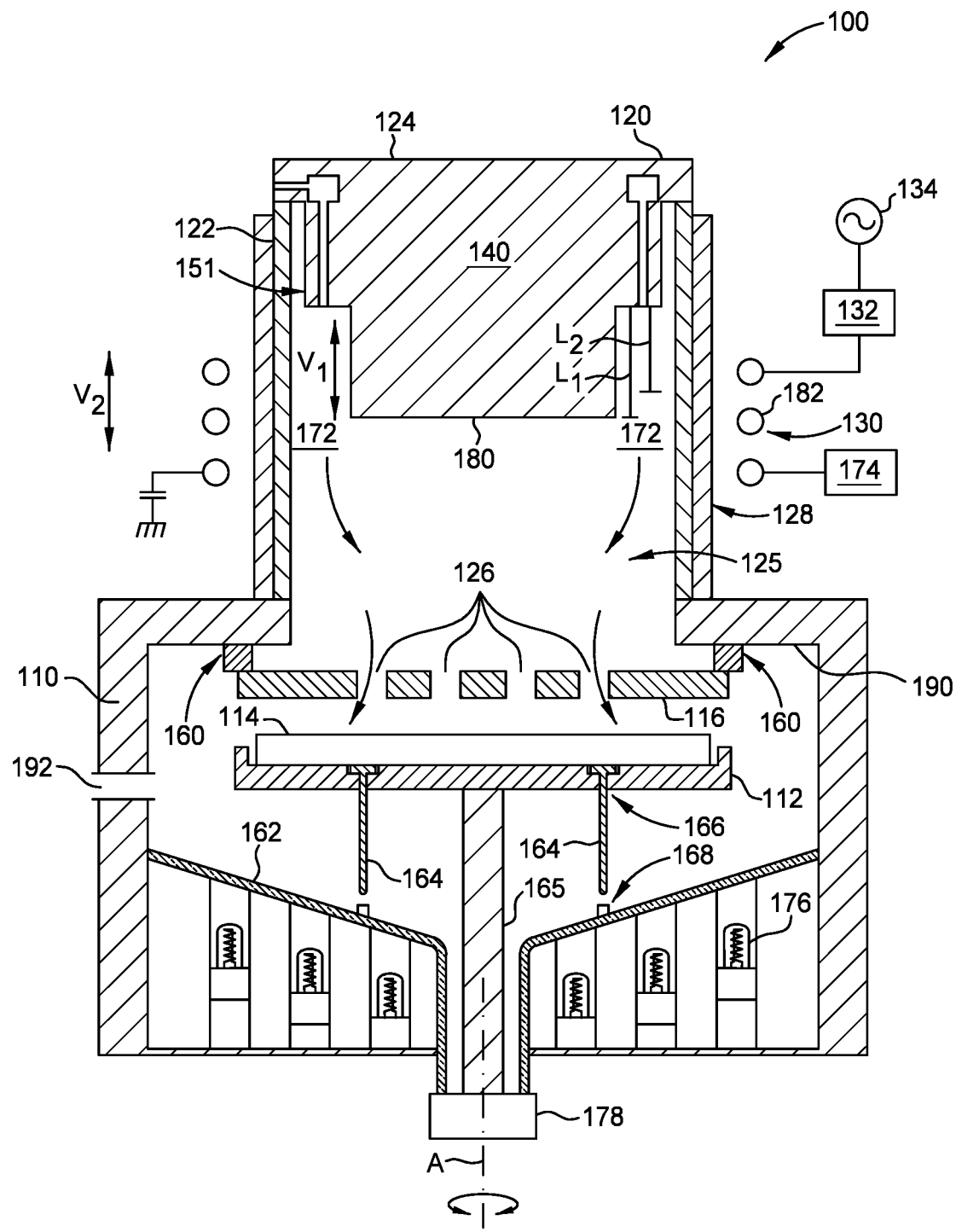
FIG. 1 is a schematic diagram of a plasma processing apparatus, according to at least one embodiment.

With reference now to the FIGS., example embodiments of the present disclosure will now be set forth. FIG. 1 depicts an example plasma processing apparatus 100. The plasma processing apparatus 100 includes a processing chamber 110 and a plasma source 120 (e.g., a remote plasma source) coupled with the processing chamber 110. The processing chamber 110 includes a substrate support 112 operable to hold a substrate 114. In some embodiments, the substrate has a thickness that is less than 1 mm. Substrate support 112 can be proximate one or more heat sources (e.g., a plurality of lamps 176) that provide heat to a substrate during processing of the substrate in the process chamber 110. Heat can be provided using any suitable heat source, such as one or more lamps, such as one or more rapid thermal processing lamps, or via a heated pedestal (e.g., a pedestal having resistive heating elements embedded therein or coupled thereto).

As shown in FIG. 1, processing chamber 110 includes window 162, such as a dome, and the plurality of lamps 176. A controller (not shown) is coupled to the chamber 110, and may be used to control chamber processes described herein. The substrate support 112 is disposed between a separation grid 116 and the window 162. A plurality of sensors (not shown) can be disposed proximate one or more of the lamps 176 and/or the substrate support 112 for measuring the temperature within the chamber 110. The plurality of lamps 176 are disposed between the window 162 and a bottom wall of the chamber 110.

The substrate support 112 is coupled with a shaft 165. The shaft is connected to an actuator 178 that provides rotational movement of the shaft and substrate support (about an axis A). Actuator 178 may additionally or alternatively provide height adjustment of the shaft 165 during processing.

The substrate support 112 includes lift pin holes 166 disposed therein. The lift pin holes 166 are sized to accommodate a lift pin 164 for lifting of the substrate 114 from the substrate support 112 either before or after a deposition process is performed. The lift pins 164 may rest on lift pin stops 168 when the substrate 114 is lowered from a processing position to a transfer position.

A plasma can be generated in plasma source 120 (e.g., in a plasma generation region) by induction coil 130 and desired particles flow from the plasma source 120 to the surface of substrate 114 through holes 126 provided in a separation grid 116 that separates the plasma source 120 from the processing chamber 110 (a downstream region).

The plasma source 120 includes a dielectric sidewall 122. The plasma source 120 includes a top cover 124. The dielectric sidewall 122 and top cover 124, integrated with an insert 140 define a plasma source interior 125. Dielectric sidewall 122 can include any suitable dielectric material, such as quartz. An induction coil 130 is disposed proximate (e.g., adjacent) the dielectric sidewall 122 about the plasma source 120. The induction coil 130 is coupled to an RF power generator 134 through any suitable matching network 132. Feed gases are introduced to the plasma source interior from a gas supply 150. When the induction coil 130 is energized with RF power from the RF power generator 134, a plasma is generated in the plasma source 120. In some embodiments, RF power is provided to coil 130 at about 1 KW to about 15 KW, such as about 3 kW to about 10 KW. Induction coil 130 may ignite and sustain a plasma in a wide pressure and flow range. In some embodiments, the plasma processing apparatus 100 includes a grounded Faraday shield 128 to reduce capacitive coupling of the induction coil 130 to the plasma.

To increase efficiency, the plasma processing apparatus 100 includes a gas injection insert 140 disposed in the chamber interior 125. The gas injection channels 151 provide the process gas to the chamber interior 125 through an active zone 172, where due to enhanced confinement of hot electrons a reaction between hot electrons and the feed gas occurs. An enhanced electron confinement region or an active zone 172 is defined by sidewalls of gas injection insert and the vacuum tube in radial direction and by the edge of the bottom surface 180 of the insert from the bottom in vertical direction. The active region 172 provides an electron confinement region within the plasma source interior 125 for efficient plasma generation and sustaining. The narrow gas injection channels 151 prevents plasma spreading from the chamber interior into the gas channel 151. Channels 151 can be about 1 mm in diameter or greater, such as about 10 mm or greater, such as about 1 mm to about 10 mm. The gas injection insert 140 forces the process gas to be passed through the active region 172 where plasma is formed.

The capabilities of the gas injection insert 140 to improve efficiency of the plasma reactor 100 are independent of the material of the gas injection insert 140 as long as the walls that are in direct contact with radicals are made of material with a low recombination rate for the radicals. For instance, in some embodiments, the gas injection insert 140 can be made from a metal, such as an aluminum material, with a coating configured to reduce surface recombination. Alternatively, the gas injection insert 140 can be a dielectric material, such as a quartz material, or an insulative material.

The coil 130 is aligned with the active region in such a way that the top turn of the coil is above the bottom edge 180 of the insert 140 and operates substantially in the active region of the inner volume, while the bottom turn of the coil is below edge 180 and operates substantially outside the active region. The center of the coil is substantially aligned with the edge 180. Within these boundaries one can adjust the coil position for a desired performance. Alignment of the coil with surface edge 180 provides improved source efficiency, namely controlled generation of desired chemical species for plasma processes and delivering them to the wafer with reduced or eliminated losses. For example, plasma sustaining conditions (balance between local generation and loss of ions) might not be the best for generating species for a plasma process. Regarding delivery of the species to the substrate, efficiency can depend on the volume and wall recombination of these particular species. Hence, control of the alignment of the coil with surface edge 180 provides control of the source efficiency for a plasma process.

In some embodiments, a coil has a short transition region near the leads, and the remainder of the coil turns are parallel to the bottom 180, in other embodiments, a coil is helical, but one can always define the top and the bottom turn of the coil. In some embodiments, a coil can have 2-5 turns.

In some embodiments, surface 180 is aligned with a portion of induction coil 130 (e.g., coil loop 182) along axis 184 by utilizing a suitably sized insert 140 (and top plate 124, which may be a preformed part of the insert 140) to form plasma source 120. Alternatively, surface 180 can be movable along a vertical direction $V_1$ relative to plasma source 120 while a remainder portion of insert 140 is static (e.g., fixed) as part of plasma source 120, in order to provide alignment of surface 180 with a portion of coil 130. For example, an actuator 170 is coupled to insert 140 to adjust a position of surface 180 such that a portion of insert 140 having a first length ($L_1$) is adjusted to a second length ($L_2$). Actuator 170 can be any suitable actuator, for example a motor, electric motor, stepper motor, or pneumatic actuator. In some embodiments, a difference (A) in length from $L_1$ to $L_2$ is about 0.1 cm to about 4 cm, such as about 1 cm to about 2 cm.

Additionally or alternatively, the insert 140 can be coupled to an actuator (such as actuator 170), and actuator 170 is configured to move the entirety of insert 140 vertically (e.g., along a vertical direction $V_1$ relative to plasma source 120), in order to align surface 180 with a portion of coil 130. Spacers (not shown) can be used to fill gap(s) between insert 140 and another portion of plasma source 120 (such as between top plate 124 and dielectric sidewall 122) that were formed by moving the insert vertically. The spacers may be formed from, for example, a ceramic material, such as a quartz.

Figure 6A:
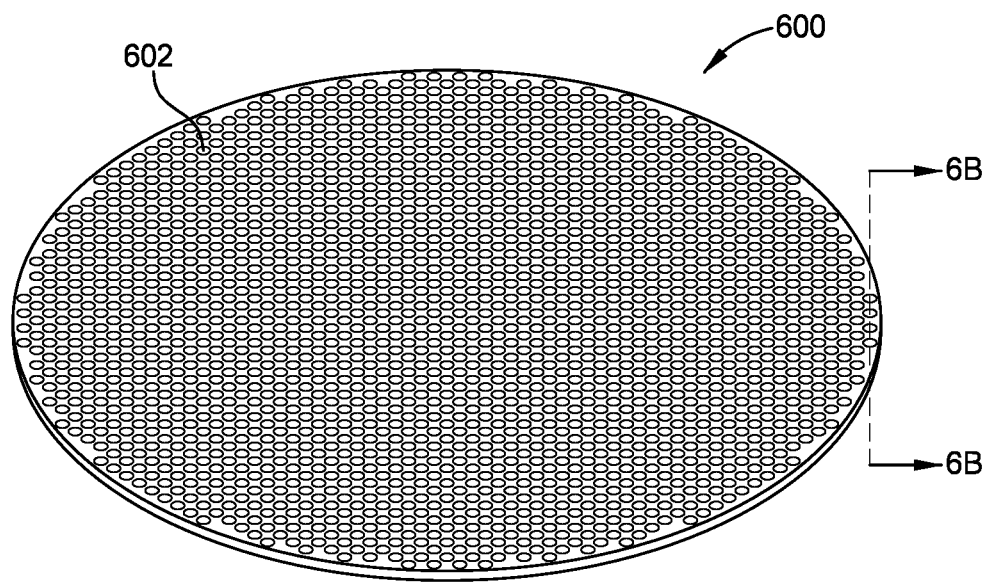
FIG. 6a is an isometric view of a separation grid, according to at least one embodiment.
Figure 6B:
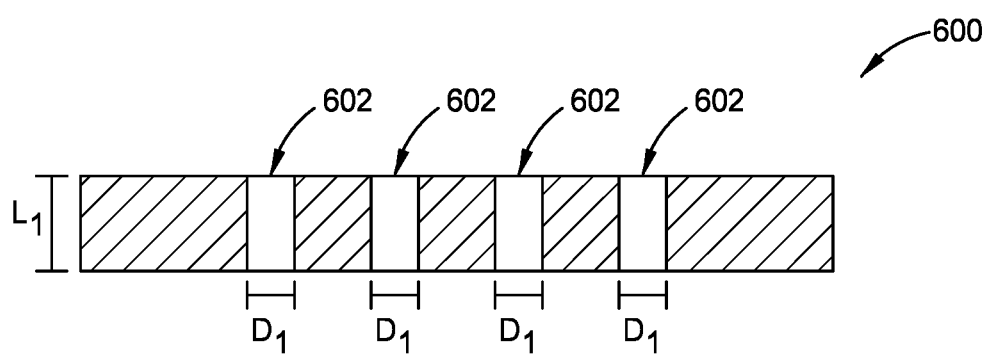
FIG. 6b is a cross-section view (along line 6B) of the separation grid of FIG. 6a, according to at least one embodiment.

In general, positioning coil 130 center above surface 180 will increase the efficiency of ionization and dissociation, but reduces the transport efficiency of these species to the substrate, as many of the species may recombine on the walls of the narrow active region. Positioning the coil 130 below surface 180 can improve plasma delivery efficiency, but may decrease plasma generation efficiency. Separation grid 116 is configured to separate a processing chamber 110 area from plasma charged particles (ions and electrons), which recombine on the grid, so that only neutral plasma species can pass through the grid into the processing chamber 110. The holes in the bottom section of the separation grid 116 may have different pattern, e.g. uniform 600 as shown in FIGS. 6a, 6b. In some embodiments, separation grid 600 is formed of aluminum, anodized aluminum, quartz, aluminum nitride, aluminum oxide, tantalum, tantalum nitride, titanium, titanium nitride, or combination(s) thereof. For example, AlN can be beneficial for flux of nitrogen radicals, whereas conventional separation grids are more prone to nitrogen radical recombination. Similarly, aluminum oxide can provide flux of oxygen or hydrogen radicals, whereas conventional separation grids are more prone to their recombination. In some embodiments, separation grid 600 has a plurality of holes 602. As shown in FIG. 6b, holes 602 are disposed through the separation grid (e.g., holes 602 traverse the thickness of the separation grid). Holes 602 may have an average diameter of about 4 mm to about 6 mm. In some embodiments, each hole of the plurality of holes 602 has a diameter ($D_1$) of about 4 mm to about 6 mm. In some embodiments, the separation grid 600 of FIGS. 6a, 6b has a thickness of about 5 mm to about 10 mm, which defines the hole length ($L_1$). A ratio of the grid thickness (length ($L_1$)) to the average diameter of the plurality of holes may be greater than about 1, such as about 1 to about 3.

Exhaust 192 is coupled with a side wall of process chamber 110. In some embodiments, exhaust 192 may be coupled with a bottom wall of process chamber 110 to provide azimuthal independence (e.g. if not rotating pedestal). If lamps are rotating, exhaust 192 can be coupled with the side wall, since rotation mitigates azimuthal dependence.

Various features of ICP sources and plasma processing apparatus will now be described with reference to FIGS. 2, 3, 4, and 5. FIGS. 2, 3, 4, and 5 are schematic diagrams of a plasma processing apparatus, according to some embodiments of the present disclosure. Plasma processing apparatus of FIGS. 2, 3, 4, and 5 may be constructed in a similar manner to plasma processing apparatus 100 (FIG. 1) and operate in a manner described above for processing apparatus 100. It will be understood that the components of plasma processing apparatus FIGS. 2, 3, 4, and 5 may also be incorporated into any other suitable plasma processing apparatus in alternative example embodiments.

Figure 2:
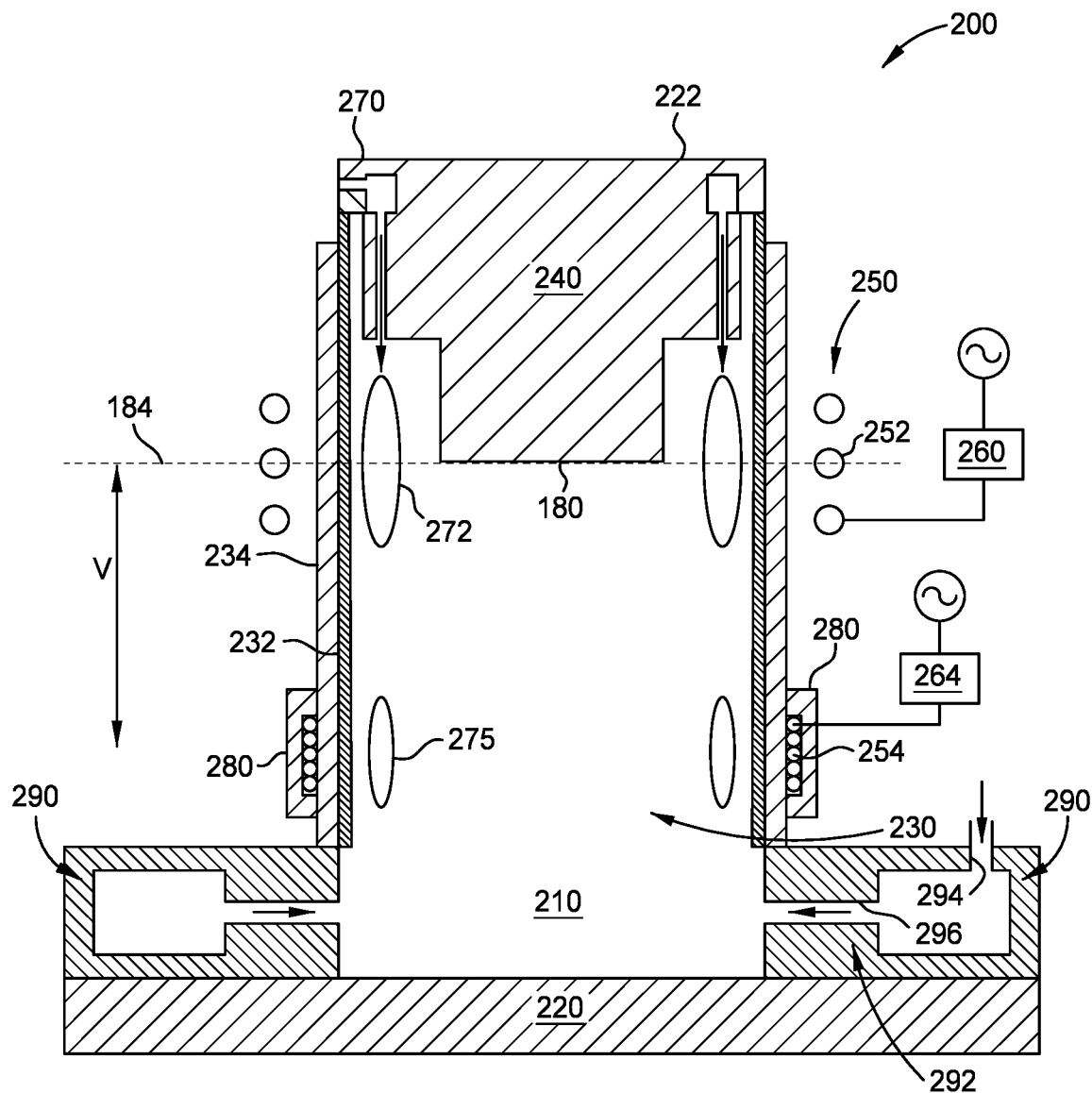
FIG. 2 is a schematic diagram of a plasma processing apparatus, according to at least one embodiment.

As shown in FIG. 2, plasma processing apparatus 200 includes a processing chamber 220 which has a separation grid (not shown) disposed therein. Plasma processing apparatus 200 includes a plasma source 222 along a vertical direction V. A substrate may be positioned in the processing chamber directly below the grid and some distance from the grid, and neutral particles from plasma source interior 230 may flow downward through separation grid toward the substrate in the processing chamber 220, and the neutral particles may contact the substrate to perform a process, e.g., a surface treatment process.

A plurality of induction coils 250 are disposed at a different position along the vertical direction V on plasma source 222, e.g., such that the induction coils (e.g., 252 and 254) are spaced from each other along the vertical direction V along plasma source 222. For example, induction coils 250 may include a first induction coil 252 and a second induction coil 254. First induction coil 252 and second induction coil 254 can be disposed around (e.g., encircle) a dielectric sidewall 232. First induction coil 252 may be positioned at a first vertical position along a vertical surface of the dielectric sidewall 232. Second induction coil 254 may be positioned at a second vertical position along a vertical surface of the dielectric sidewall 232. The first vertical position is different from the second vertical position. For instance, the first vertical position may be above the second vertical position. In some embodiments, a portion of the first induction coil 252 is substantially aligned with a surface 180 of the insert as was described above. The second induction coil 254 is disposed at a bottom (e.g., lower) portion of plasma source 200. The second induction coil includes magnetic field concentrator(s) 280, allowing a placement of the coil in the bottom of the plasma source, as shown in FIG. 2. The use of magnetic field concentrators 280 increases efficiency of the plasma generation at the bottom of the source and significantly increases the radial control near the substrate (as compared to the absence of magnetic field concentrators). In some embodiments, induction coil 254 is disposed at a bottom ⅓ height, such as a bottom ¼ height, of plasma source 222.

Induction coils 250 (252, 254) may be operable to generate (or modify) an inductive plasma within plasma source interior 230. For example, plasma processing apparatus 200 may include a radio frequency power generator 262 (e.g., RF generator and matching network) coupled with coil 252. Induction coil 254 is coupled to a second RF generator 264

(e.g., RF generator and matching network). The frequency and/or power of RF energy applied by the first RF generator 262 to the first induction coil 252 and the second RF generator 264 to the second induction coil 254, respectively, can be independent in order to better control process parameters of a surface treatment process.

For example, frequency and/or power of RF energy applied by the second RF generator 264 can be less than the frequency and/or power of RF energy applied by the first RF generator 262. Radio frequency power generator 262 is operable to energize induction coil 252 to generate the inductive plasma in plasma source interior 230. In particular, radio frequency power generator 262 may energize induction coil 252 with an alternating current (AC) of radio frequency (RF) such that the AC induces an alternating magnetic and electric fields inside the volume near induction coil 252 that heats electrons to generate the inductive plasma. In some embodiments, RF power is provided to coil 252 at about 1 KW to about 15 KW, such as about 3 kW to about 15 KW. Induction coil 252 may ignite and sustain a plasma in a wide pressure and flow range.

Radio frequency power generator 264 is operable to energize induction coil 254 to generate and/or modify plasma in plasma source interior 230. In particular, radio frequency power generator 264 may energize induction coil 254 with an alternating current (AC) of radio frequency (RF) such that inductive RF electric field inside the volume adjacent to induction coil 254 accelerate electrons to generate plasma. In some embodiments, RF power is provided to coil 254 at about 0.5 KW to about 6 KW, such as about 0.5 KW to about 3 KW. Induction coil 254 may modify the plasma density in the plasma processing apparatus 200, e.g., induction coil 254 can tune the radial profile of the plasma to promote additional plasma uniformity moving toward a substrate in chamber 220. Since coil 252 is further away from a substrate during use than coil 254, the plasma and radicals generated by coil 252 can promote a dome shaped profile near the substrate, and the coil 254 can flatten (or even raise the edge) the dome-shaped plasma profile as plasma approaches the substrate.

A dielectric sidewall 232 is positioned between induction coils 250 and plasma source 222. Dielectric sidewall 232 has a generally cylindrical shape. An electrically grounded Faraday shield 234 may be made of metal and/or is positioned between induction coils 250 and the dielectric sidewall 232. Faraday shield 234 has a cylindrical shape and is disposed about dielectrical sidewall 232. The grounded faraday shield 234 extends the length of the plasma source 222. Dielectric sidewall 232 contains plasma within plasma source interior 230 allowing RF fields from induction coils 250 to pass through to plasma source interior 230, and grounded Faraday shield 234 reduces capacitive coupling of the coils 250 to the plasma within plasma source interior 230. In some embodiments, Faraday shield 234 can be a metal cylinder having slots perpendicular to the coil direction. The vertical slots are in the area of the coil (e.g., adjacent the coil), while at least one vertical end of the coil (above or below the coil) has a complete current path around the cylinder. A Faraday shield may have any suitable thickness, and/or the slots may have any suitable shape. Near the coil(s), the slots can be relatively narrow (e.g., about 0.5 cm to about 2 cm) and substantially vertical, even when utilizing a helical coil.

As noted above, each induction coil 250 is disposed at a different position along the vertical direction V on plasma source 222 adjacent a vertical portion of a dielectric sidewall of the plasma source 222. In this way, each induction coil 250 can be operable to generate (or modify) a plasma in a region adjacent to the coil along the vertical surface of the dielectric sidewall 232 of the plasma source 222.

In some embodiments, the plasma processing apparatus 200 includes one or more gas injection ports 270 disposed through a gas injection insert 240 of the plasma source 222, radially outward of the injection insert 240. The gas injection ports 270 and a side shape of the insert are operable to inject process gas at the periphery of the plasma source interior 230, directly into active plasma generation region adjacent the vertical surface of the dielectric sidewall 232. For example, there may be >20 (e.g. 70-200) vertical injection holes disposed through insert 240. For instance, the first induction coil 252 can be operable to generate a plasma in region 272 proximate a vertical surface of the dielectric sidewall 232. The second induction coil 254 can be operable to generate or modify a plasma present in region 275 proximate a vertical surface of the dielectric sidewall 232. The gas injection insert 240, in some embodiments, can further define an active region for generation of the plasma in the plasma source interior 230 adjacent the vertical surface of the dielectric sidewall 232. A top portion of a gas injection insert of the present disclosure can have a diameter of about 10 cm to about 15 cm. A bottom portion of a gas injection insert of the present disclosure can have a diameter of about 7 cm to about 10 cm.

Plasma processing apparatus 200 can have a bottom edge gas injection port 290 configured to introduce the same or different gas to volume 210 as the gas injection port 270 provides to plasma source interior 230. Edge gas injection port 290 is coupled with process chamber 220 and is a top plate of the process chamber 220. Edge gas injection port 290 includes a circular plenum 292 to which gas is introduced through inlet 294. Gas flows from the plenum 292 through one or more openings 296 to the volume 210. Edge gas injection port 290 can provide fine tuning of the plasma chemistry near the edge of a substrate, and/or improve plasma uniformity at the substrate. For example, edge gas injection port 290 can provide modification of the flow (same gas), and/or modification of chemistry (chemical reaction between plasma radicals and new feed gas or different gases).

Plasma processing apparatus 200 has improved source tunability relative to known plasma processing apparatus. For example, induction coils 250 can be positioned in two locations along the vertical surface of the dielectric sidewall 232 such that functions of the top coil 252 proximate to the active plasma generation region are plasma ignition and sustaining in the plasma source interior 230, and functions of the second coil 254 placed at the bottom of the source allow the advantageous source tunability. The low positioning of the second coil is possible due to the use of magnetic field concentrators 280, which provides coupling of the coil to plasma rather than to surrounding metal (e.g., 290). In such a manner, a treatment process performed with plasma processing apparatus 200 on a substrate may be more uniform.

Figure 3:
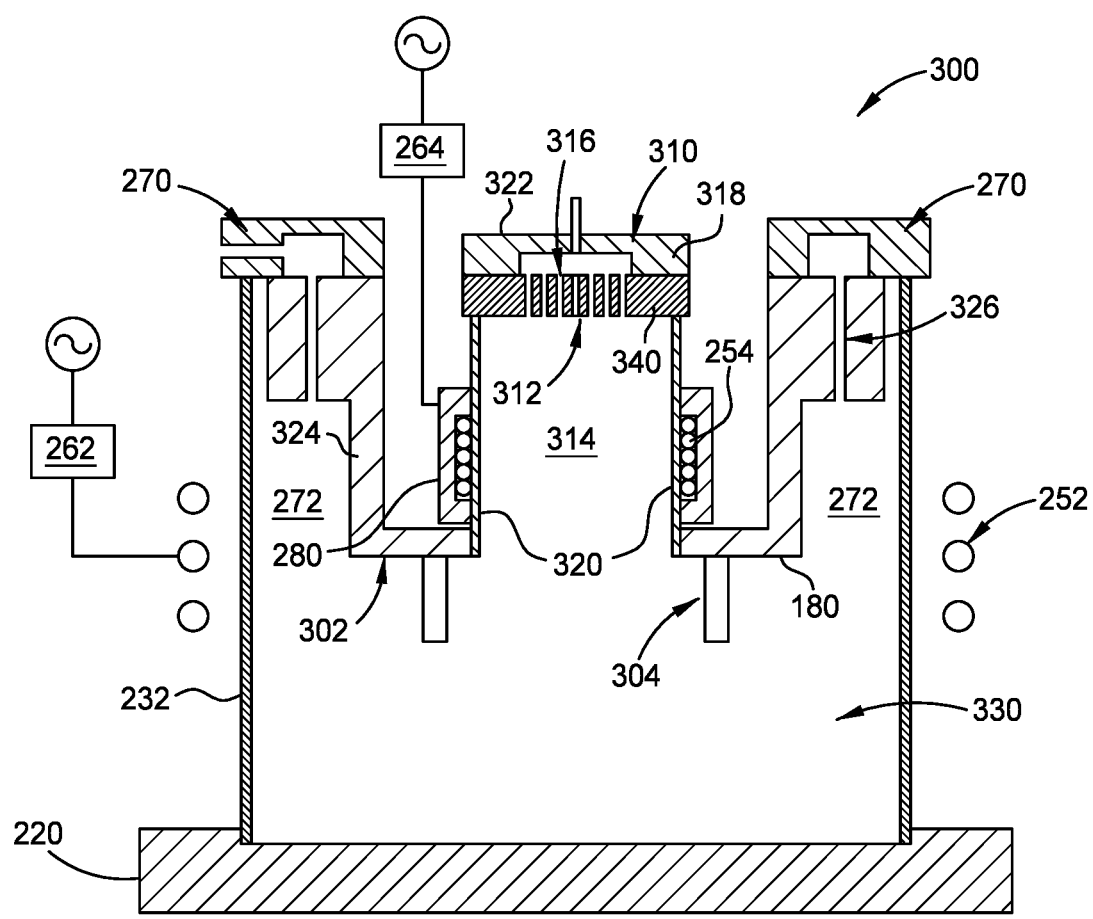
FIG. 3 is a schematic diagram of a plasma processing apparatus, according to at least one embodiment.

FIG. 3 is a schematic diagram of a plasma processing apparatus 300. Processing apparatus 300 includes plasma source 322 and processing chamber 220. Plasma source 322 includes insert 302 having a peripheral gas injection port 270 and center gas injection port 310. Center gas injection port 310 is formed by top plate 318 and bottom plate 340 forming a plenum 316. Bottom plate 340 has a plurality of holes (throughholes) 312 to enable the center gas injection port 310/insert 302 to have a plurality of the holes (throughholes) 312 for providing process gas into center process region 314. The dimensions of center process region 314 are provided by portions of insert 302, namely center gas injection port 310 and sidewall 320. Sidewall 320 has a cylindrical shape and is a dielectric material. For example, the sidewall 320 is formed from quartz or alumina. The dimensions of peripheral process region 272 are provided by dielectric sidewall 232 and insert 302, namely gas injection port 270 and sidewall 324. Sidewall 324 (and insert 302 in general) can have a cylindrical shape. Sidewall 324 surface material can be a dielectric material or a metal. For example, the sidewall 324 is formed from aluminum and may be covered with quartz, or alumina, or have bare or anodized aluminum surface. In addition, a first Faraday shield (not shown) can be disposed between coil 252 and dielectric sidewall 232. Likewise, a second Faraday shield (not shown) can be disposed between coil 254 and sidewall 320. In some embodiments, sidewall 320 is quartz or ceramic and/or has a thickness of about 2.5 mm to about 5 mm. Coil 252 is disposed around (e.g., encircles) sidewall 320. Coil 254 is disposed around (e.g., encircles) sidewall 232, coil 254, and sidewall 320.

A flow rate of process gas provided by peripheral gas injection port 270 via conduit 326 to peripheral process region 272 can be greater than a flow rate of process gas provided by center gas injection port 310 to center process region 314. In some embodiments, a ratio of flow rate of process gas provided by peripheral gas injection port 270 to a flow rate of process gas provided by center gas injection port 310 is about 2:1 to about 20:1, such as about 5:1 to about 10:1. Providing a higher flow rate to peripheral process region 272 than a flow rate to center process region 314 provides improved center-edge uniformity of a plasma at a substrate surface of a substrate present in processing chamber 220.

Processing apparatus 300 further includes peripheral coil 252 and center coil 254. An RF power provided by peripheral coil 252 can be greater than an RF power provided by center coil 254. In some embodiments, a ratio of RF power provided by peripheral coil 252 to RF power provided by center coil 254 is about 2:1 to about 20:1, such as about 3:1 to about 10:1, such as about 5:1. If the center coil is not energized, the secondary plasma source serves as auxiliary gas injection that reduces fluxes of radicals and ions/electrons created by the main coil 252 toward the center of the substrate. Because plasma density is typically higher at a center of a substrate during conventional plasma processes, providing a greater RF power to peripheral induction coil 254 than RF power provided to center induction coil 252 promotes increased plasma density at an edge portion(s) of the substrate, improving plasma uniformity. Plasma separators 304 (cylindrical protrusions) between central and edge areas improve the capability of independent central-edge plasma control.

Peripheral coil 252 and center coil 254 may be operable to generate (or modify) an inductive plasma within plasma source interior 330. For example, plasma processing apparatus 300 may include a radio frequency power generator 262 (e.g., RF generator and matching network) coupled with peripheral coil 252. Center coil 254 is coupled to a second RF generator 264 (e.g., RF generator and matching network). The frequency and/or power of RF energy applied by the first RF generator 262 to the peripheral coil 252 and the second RF generator 264 to the center coil 254, respectively, can be adjusted to be the same or different to control process parameters of a substrate treatment process.

For example, frequency and/or power of RF energy applied by the second RF generator 264 can be less than the frequency and/or power of RF energy applied by the first RF generator 262. Radio frequency power generator 262 is operable to energize peripheral coil 252 to generate the inductive plasma in plasma source interior 330. In particular, radio frequency power generator 262 may energize peripheral coil 252 with an alternating current (AC) of radio frequency (RF) such that the AC induces an alternating magnetic field inside peripheral coil 252 that heats a gas to generate the inductive plasma. In some embodiments, RF power is provided to the peripheral coil 252 at about 1 kW to about 15 KW, such as about 3 KW to about 10 KW.

Radio frequency power generator 264 is operable to energize center coil 254 to generate and/or modify an inductive plasma in center region 314 of plasma source 322. In particular, radio frequency power generator 264 may energize center coil 254 with an alternating current (AC) of radio frequency (RF) such that the AC induces an alternating magnetic field inside induction coil 254 that heats a gas to generate and/or modify the inductive plasma. In some embodiments, RF power is provided to center coil 254 at about 0.3 KW to about 3 KW, such as about 0.5 KW to about 2 kW. Center coil 254 may modify the plasma in the plasma processing apparatus 300, e.g., center coil 254 can tune the radial profile of the plasma to promote additional plasma uniformity moving toward a substrate in chamber 220.

In some embodiments, the plasma processing apparatus 300 includes a gas injection port 270 operable to inject process gas at the periphery of the region 272 along a vertical surface of the dielectric sidewall 232, defining active plasma generation region(s) adjacent the vertical surface of the dielectric sidewall 232. For instance, the peripheral coil 252 can be operable to generate a plasma in region 272 proximate a vertical surface of the dielectric sidewall 232. The center coil 254 can be operable to generate and/or modify a plasma present in a center region 314 proximate a vertical surface of the sidewall 320. The gas injection insert 302, in some embodiments, can further define an active region for generation of the plasma in the plasma source interior adjacent the vertical surface of the dielectric sidewall 232 and the vertical surface of the sidewall 320.

In practice, the substrate can be provided some overlap of the process plasma formed in region 314 with the process plasma formed in region 272. Overall, peripheral and center process gas injection ports (270, 310) and induction coils (252, 254) can provide improved plasma and process uniformity (center-to-edge plasma control) for treating a substrate with a plasma. To enhance center-to-edge process control, insert 302 includes a separator 304. Separator 304 may be a uniform cylindrical separator coupled with (e.g., disposed along) inert bottom surface 180.

In addition, in embodiments where the process gas provided by center gas injection port 310 is different than process gas provided by peripheral gas injection port 270, new plasma chemistries may be obtained as compared to conventional plasma processes using a conventional plasma source. For example, advantageous processing of substrates may be provided, which cannot be obtained in conventional plasma processing. For example, a unique mix of plasma can be created if one mixes a plasma generated flow of radicals and excited species (e.g., some embodiments of region 272) with a flow of different plasma rich on different kind of plasma species, e.g. different radicals. In addition, formation of these unique plasma chemistries can be obtained in embodiments utilizing alignment of surface 180 with a portion of coil 252, e.g., as described above.

Figure 4:
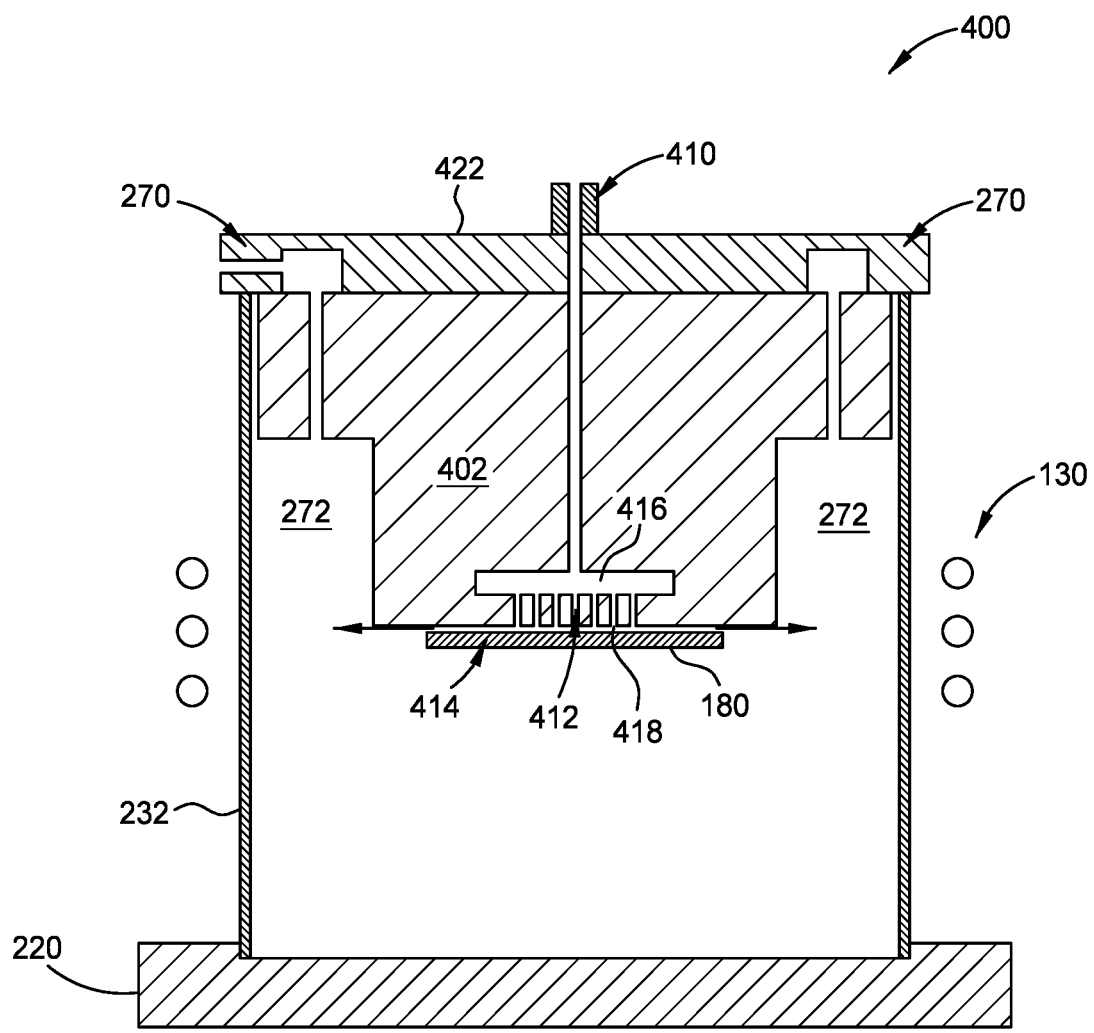
FIG. 4 is a schematic diagram of a plasma processing apparatus, according to at least one embodiment.

FIG. 4 is a schematic diagram of a plasma processing apparatus 400. Plasma processing apparatus 400 includes plasma source 422. Plasma source 422 includes gas injection insert 402, which can be integrated with the top cover, peripheral gas injection port 270, and center gas injection port 410. Center gas injection port 410 is disposed within gas injection insert 402 to fluidly couple center gas injection port 410 with a gas distribution plenum 416 of gas injection insert 402. Gas distribution plenum 416 provides an increased diameter (as compared to a diameter of port 410) for a process gas to distribute uniformly before the process gas enters the exhaust region between the bottom of the insert 180 and the distribution platform 414. Induction coil 130 is disposed around (e.g., encricles) dielectric sidewall 232. Once the gas is provided through holes 412, platform 414 provides a second gas distribution plenum 418 and promotes an outward flow of the gas to a periphery (e.g., into regions 272) of plasma source 422. In some embodiments of the present disclosure, the material to form holes 412 is absent and a larger plenum is formed. Platform 414 can be coupled with insert 402 via a plurality of screws or bolts (not shown). Platform 414 can be made of quartz or ceramic. Platform 414 can have any suitable design, which allows different materials. The outward/sideways flow of gas promoted by platform 414 can affect the flow profile of gas/plasma to a substrate during processing, improving center-to-edge uniformity, as compared to conventional plasma process apparatus. In addition, this outward flow of the gas to a region adjacent to a plasma generation region (e.g., 272) of plasma source 400 provides benefits. Because high plasma density can be created in a region 272 adjacent to the top part of the coil 130, the electric field does not penetrate far away from the coil, so the gas from the center injection 410-416-414 does not experience a lot of ionization or dissociations, but the gas interacts chemically with high density radicals and ions created in the active region 272. Both radicals and ions are active chemically and interact with a new feed gas from the center injection 410-416-414. The new feed gas, radicals, and ions may create new plasma chemistries as compared to conventional plasma sources using a plasma process chamber. For example, a unique mix of plasma can be created if one mixes a plasma generated flow of radicals and excited species (e.g., some embodiments of region 272) with a new flow of gas that didn't pass through the plasma generation region 272 with hot electrons (e.g., the process gas provided by injection port 410 and platform 414/region 418). For example, one can mix flow of $H^+$ and H-radicals obtained in plasma from the $H_2$ feed gas (e.g., from gas provided by injection port 270) with a flow of oxygen $O_2$ (e.g., from gas provided by injection port 410), where one can significantly increase fraction of $HO_2$, HO, $H_2O_2$ and other non-equilibrium molecules, etc. in the region adjacent to active region 272 related to induction coil 130. In addition, formation of these unique plasma chemistries can be obtained in embodiments utilizing alignment of surface 180 edge with a portion of coil 130, e.g., as described above.

In some embodiments, a ratio of flow rate of process gas provided by peripheral gas injection port 270 to a flow rate of process gas provided by center gas injection port 410 is about 20:1 to about 1:20, such as about 10:1 to about 1:10, such as about 2:1 to about 1:2, such as about 1.2:1 to about 1:1.2, such as about 1:1. Such flow rates may provide a stoichiometry (e.g., substantially equimolar amounts) of the different process gases to provide desired densities of chemical species in a plasma formed in regions 272.

In addition, the outward/sideways flow provided by center gas injection port 410 and platform 414/region 418 can modify flow patterns within the plasma source 400 affecting delivery profile of radicals to the substrate. For example, in embodiments where the process gas provided by center injection port 410 is substantially the same as the process gas provided by peripheral injection port 270, more plasma flow is promoted toward an edge of a substrate, improving the center-edge plasma profile (e.g., uniformity of plasma provided to the substrate).

In addition, in embodiments where the process gas provided by center gas injection port 410 is different than process gas provided by peripheral gas injection port 270, new plasma chemistries may be obtained as compared to conventional plasma processes using a conventional plasma source. For example, advantageous processing of substrates may be provided, which cannot be obtained in conventional plasma processing. For example, a unique mix of plasma can be created if one mixes a plasma generated flow of radicals and excited species (e.g., some embodiments of region 272) with a new flow of gas that didn't pass through the plasma region with hot electrons. For example, one can mix flow of $H^+$ and H-radical obtained in plasma from the $H_2$ feed gas with a flow of oxygen $O_2$, where one can generate a large number of different radicals like $HO_2$, $H_2O_2$ molecules, etc. in a region of plasma processing apparatus 400 that is downstream of regions 272. In addition, formation of these unique plasma chemistries can be obtained in embodiments utilizing alignment of surface 180 with a portion of coil 252, e.g., as described above.

Figure 5:
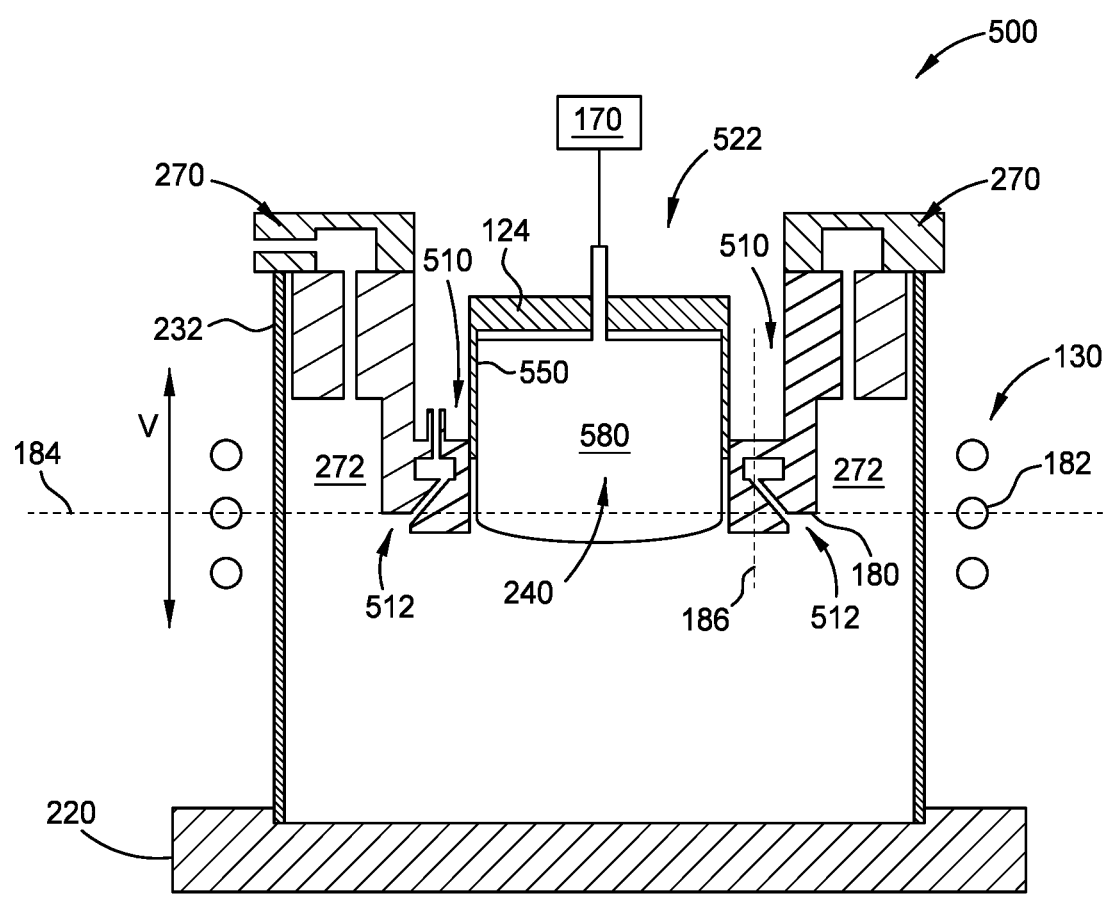
FIG. 5 is a schematic diagram of a plasma processing apparatus, according to at least one embodiment.

FIG. 5 is a schematic diagram of a plasma processing apparatus 500. Processing apparatus 500 includes plasma source 522 and processing chamber 220. Plasma source 522 includes gas injection insert 240, peripheral gas injection port 270, center gas injection port 510, and top plate 124. Center gas injection port 510 can be disposed proximate (e.g., adjacent) a sidewall 550. Center gas injection includes a port 510 having a generally cylindrical plenum/manifold and plurality of angled injection outlets 512 uniformly spread along the plenum. Gas injection insert 240 can likewise have a generally cylindrical shape. Center gas injection port 510 has angled outlet 512 to promote outward/sideways flow of process gas provided by center injection port 510 and angled outlets 512. Angled outlets 512 can have an angle of about 0 degree to about 90 degrees, such as about 30 degrees to about 60 degrees, such as about 45 degrees, relative to a vertical axis (such as vertical axis 186, which is parallel to an axial centerline of processing apparatus 500 and/or the axial centerline of the plasma source 522). Center gas injection port 510 is disposed around (e.g., encircles) sidewall 550. Peripheral gas injection port 270 is disposed around (e.g., encircles) center gas injection port 510 and sidewall 550. An induction coil 130 is disposed around (e.g., encircles) peripheral gas injection peripheral gas injection port 270, center gas injection port 510, and sidewall 550. Dielectric sidewall 232 is proximate the peripheral gas injection port 270 and disposed around the peripheral gas injection port 270, the sidewall 550, and the center gas injection port 510.

The outward/sideways flow of gas promoted by angled outlet 512 can affect the flow profile of gas/plasma to a substrate during processing, improving center-to-edge uniformity, as compared to conventional plasma process apparatus. In addition, because a high plasma density can be created in a region adjacent coil 130 (and the electric field does not penetrate far away from the coil), new plasma chemistries can be obtained as compared to conventional plasma processes using a plasma process chamber. For example, a unique mix of plasma can be created if one mixes a plasma generated flow of radicals and excited species (e.g., some embodiments of region 272) with a new flow of gas that didn't pass through the plasma region with hot electrons (e.g., the process gas provided by injection port 510 and angled outlet 512). For example, one can mix flow of $H^+$ and H-radicals obtained in plasma from the $H_2$ feed gas (e.g., from gas provided by injection port 270) with a flow of oxygen $O_2$ (e.g., from gas provided by injection port 510), where one can generate molecular radicals like $HO_2$, $H_2O_2$, etc. in process region 272 adjacent induction coil 130. In addition, formation of these unique plasma chemistries can be obtained in embodiments utilizing alignment of coil 130 with surface edge 180, as described above.

In some embodiments, a ratio of flow rate of process gas provided by peripheral gas injection port 270 to a flow rate of process gas provided by center gas injection port 510 is about 2:1 to about 1:2, such as about 1.2:1 to about 1:1.2, such as about 1:1. Such flow rates may provide a stoichiometry (e.g., substantially equimolar amounts) of the different process gases to provide desired densities of chemical species in a plasma formed in regions 272.

In addition, the outward/sideways flow provided by center gas injection port 510 and angled outlets 512 can modify flow patterns within the plasma source 500 affecting delivery profile of radicals to the substrate. For example, in embodiments where the process gas provided by center injection port 510 is substantially the same as the process gas provided by peripheral injection port 270, more plasma flow is promoted toward an edge of a substrate, improving the center-edge plasma profile (e.g., uniformity of plasma provided to the substrate).

Furthermore, gas injection insert 240 of FIG. 5 has a fixed edge at the bottom surface 180, defining the active region that marks the alignment level 184 for the induction coil 130. The coil 130 is substantially aligned with surface 180 in such a way that the top turn of the coil is positioned above the level 184 (edge 180), and the bottom turn is positioned below the edge. One may further adjust position of the coil within this range based on the process results. Alignment of coil vertical center with surface 180 provides improved source efficiency, namely controlled generation of desired chemical species for plasma processes and delivering them to the wafer with minimum losses. For example, plasma sustaining conditions (balance between local generation and loss of ions) might not work well for generating species for a plasma process. Regarding delivery of the species to the substrate, efficiency can depend on the volume and wall recombination of these particular species. Hence, control of the alignment of the coil 130 with the edge (surface) 180 provides control of the source efficiency for a plasma process.

In some embodiments, a bottom surface of insert 240 is aligned with the bottom edge portion 180 of the insert defining the active region for the coil (this alignment level is shown as axis 184) by utilizing a suitably sized insert 240 to form plasma source 120. Alternatively, the bottom surface of the insert 240 can be made flexible using a (e.g., movable) central part 580 as shown in FIG. 5 of the insert 240, while a remainder portion of insert 240 is fixed as part of plasma source 120. For example, an actuator 170 can be electronically coupled with the central part of insert 240 to adjust the central part such that the central part of insert 240 having a first position is adjusted to a second position. In some embodiments, a difference (Δ) in position from the first position to the second position is about 0.1 cm to about 10 cm, such as about 1 cm to about 2 cm. Actuator 170 can be any suitable actuator, for example a motor, electric motor, stepper motor, or pneumatic actuator. Movement of the central part of the insert 240 by actuator 170 increases or decreases a space between the central part and top plate 124.

In general, moving the central part of the insert 240 downward along a vertical direction V will reduce the flow of active species toward the center of the substrate and thus decrease the process rate in the center vs. edge, while moving the central part upward will increase the process rate in the center vs. edge.

Although the Figures have been described independently, it is to be understood that one or more embodiments from one Figure may be beneficially incorporated with one or more embodiments of a different Figure. For example, gas injection insert 140 of FIG. 1 or gas injection insert 240 of FIG. 2 may be gas injection insert 302 of FIG. 3, gas injection insert 402 of FIG. 4, or the configuration of gas injection insert 240 and center gas injection port 510 of FIG. 5. As another non-limiting example, gas injection port 290 may be included as an embodiment with the plasma processing apparatus 300 of FIG. 3, plasma processing apparatus 400 of FIG. 4, and plasma processing apparatus 500 of FIG. 5.

Figure 7:
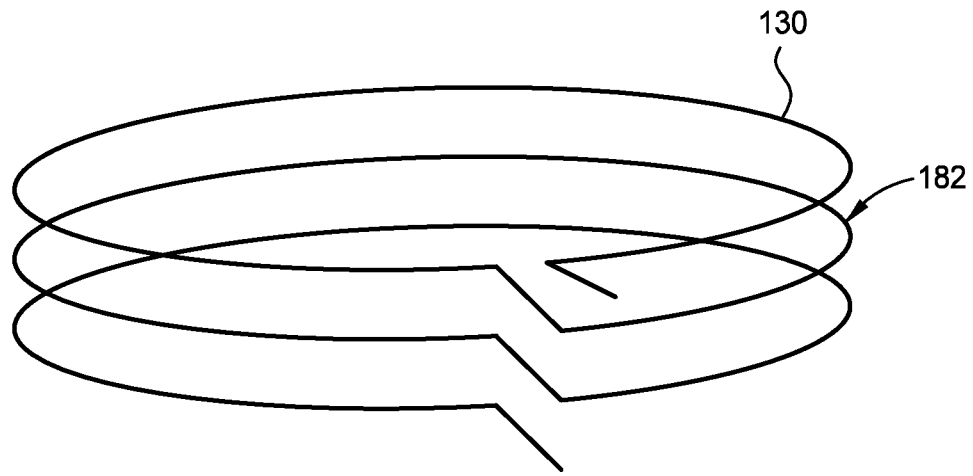
FIG. 7 is an induction coil that can be used with a plasma source, according to at least one embodiment.

FIG. 7 is an induction coil 130 that can be used with a plasma source. Induction coil 130 includes a plurality of coil loops including coil loop 182. The induction coil 130 includes 3 complete coils, but more or less coils are contemplated. For example, an induction coil may have 2-6 complete turns for RF frequency of 13.56 MHz. More turns may be utilized for lower RF frequency.

Figure 8:
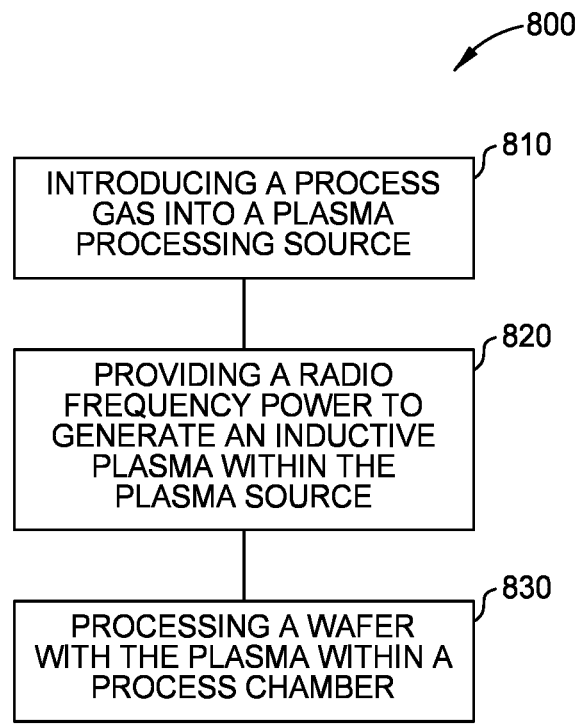
FIG. 8 is a flow diagram of a process, according to at least one embodiment.

FIG. 8 is a flow diagram of a method 800 for plasma processing a substrate with a plasma processing apparatus of the present disclosure. Method 800 may include introducing 810 a process gas into a plasma processing source and providing 820 a radio frequency power to generate an inductive plasma within the plasma source. In some embodiments, a radio frequency power may be about 1 kW to about 20 KW, such as about 5 KW to about 8 KW. From an interior region of the plasma source, neutral particles of the inductive plasma flow through a separation grid to the substrate within a processing chamber. Method 800 further includes processing 830 the substrate within the process chamber. The substrate in the processing chamber may be exposed to neutral particles generated in the inductive plasma that pass through the separation grid. The neutral particles can be used, for instance, as part of a surface treatment process of the substrate. A pressure within the processing chamber may be about 10 mT to about 5 Torr, while processing the substrate. A temperature within the process chamber can be about 350° C. to about 1,000° C., such as about 450° C. to about 900° C., while processing the substrate. Method 800 can be performed using any of the plasma processing apparatus of the present disclosure.

The plasma can be generated by energizing one or more induction coils proximate the plasma source with RF energy to generate a plasma using a process gas introduced into the plasma source. For instance, process gas can be admitted into the plasma source from a gas source. RF energy from RF source(s) can be applied to induction coil(s) to generate a plasma in the plasma source.

ADDITIONAL ASPECTS

The present disclosure provides, among others, the following aspects, each of which may be considered as optionally including any alternate aspects:

Clause 1. A plasma source, comprising:
  a sidewall and a gas injection insert defining a plasma source interior volume;

the gas injection insert comprising a peripheral gas injection port, the gas injection insert disposed within the plasma source interior volume, the gas injection insert having a movable surface relative to a top portion of the gas injection insert, the gas injection insert defining a gas injection channel proximate the sidewall; and an actuator configured to move the movable surface relative to the top portion of the gas injection insert.

Clause 2. An apparatus comprising:
a processing chamber;
the plasma source of Clause 1; and
a separation grid disposed within the processing chamber.

Clause 3. The apparatus of Clauses 1 or 2, wherein the separation grid comprises aluminum nitride or aluminum oxide.

Clause 4. The apparatus of any of Clauses 1-3, wherein the processing chamber comprises:
a substrate support operable to support a substrate in the processing chamber;
a plurality of lamps; and
a window disposed between the substrate support and the plurality of lamps.

Clause 5. The plasma source of any of Clauses 1-5, further comprising:
an induction coil disposed proximate the sidewall and disposed around the sidewall; and
a radio frequency power generator coupled with the induction coil.

Clause 6. The plasma source of any of Clauses 1-6, wherein the movable surface of the gas injection insert is substantially aligned along a vertical center of the induction coil within about 1 cm to about 2 cm of the vertical center axis of the induction coil Clause 7. A plasma source, comprising:
a sidewall, a peripheral gas injection port, and a plate defining a plasma source interior volume;
a gas injection insert coupled with the plate and disposed within the plasma source interior volume, the gas injection insert defining a gas injection channel proximate the sidewall; and
an actuator configured to move the gas injection insert along a direction while the plate is static relative to the gas injection insert.

Clause 8. An apparatus comprising:
a processing chamber;
the plasma source of Clause 8; and
a separation grid disposed within the processing chamber.

Clause 9. The apparatus of Clauses 7 or 8, wherein the separation grid comprises aluminum nitride or aluminum oxide.

Clause 10. The apparatus of any of Clauses 7 to 9, wherein the processing chamber comprises:
a substrate support operable to support a substrate in the processing chamber;
a plurality of lamps; and
a dome disposed between the substrate support and the plurality of lamps.

Clause 11. The plasma source of any of Clauses 7 to 10, wherein the gas injection insert and the plate define a volume that allows movement of the gas injection insert.

Clause 12. The plasma source of any of Clauses 7 to 11, further comprising:
an induction coil disposed proximate the sidewall and disposed around the sidewall; and
a radio frequency power generator coupled with the induction coil.

Clause 13. The plasma source of any of Clauses 7 to 12, wherein a plane of a bottom surface of the gas injection insert is substantially aligned along a vertical center of the induction coil within about 1 cm to about 2 cm of the vertical center.

Clause 14. A plasma source, comprising:
a sidewall and a gas injection insert defining a plasma source interior volume;
the gas injection insert disposed within the plasma source interior volume, the gas injection insert defining a gas injection channel proximate the sidewall;
a first induction coil disposed at a first position proximate the sidewall and disposed around the sidewall;
a first radio frequency power generator coupled with the first induction coil;
a second induction coil disposed at a second position proximate the sidewall and disposed around the sidewall, wherein the second position is below the first position and is at a bottom ⅓ height of the plasma source; and
a second radio frequency power generator coupled with the second induction coil.

Clause 15. The plasma source of Clause 14, wherein the second position is at a bottom ⅕ height of the plasma source.

Clause 16. The plasma source of Clauses 14 or 15, wherein:
the first radio frequency power generator is configured to provide a power of about 10 KW to about 20 KW to the first induction coil, and
the second radio frequency power generator is configured to provide a power of about 1 KW to about 6 KW to the second induction coil.

Clause 17. The plasma source of any of Clauses 14 to 16, further comprising an edge gas injection port coupled with the separation grid.

Clause 18. The plasma source of any of Clauses 14 to 17, further comprising an edge gas injection port coupled with the sidewall.

Clause 19. The plasma source of any of Clauses 14 to 18, wherein a plane of a bottom surface of the gas injection insert is substantially aligned along a vertical center of the induction coil within about 1 cm to about 2 cm of the vertical center.

Clause 20. An apparatus comprising:
a processing chamber;
the plasma source of any of Clauses 14 to 19; and
a separation grid disposed within the processing chamber.

Clause 21. The apparatus of any of Clauses 14 to 20, wherein the second induction coil is proximate the separation grid.

Clause 22. The apparatus of any of Clauses 14 to 21, wherein the separation grid comprises aluminum nitride or aluminum oxide.

Clause 23. The apparatus of any of Clauses 14 to 22, wherein the processing chamber comprises a substrate support operable to support a substrate in the processing chamber;
a plurality of lamps; and
a dome disposed between the substrate support and the plurality of lamps.

Clause 24. A plasma source, comprising:
  a first sidewall and a gas injection insert comprising a peripheral gas injection port, a second sidewall disposed concentric with the first sidewall, and a center gas injection port defining a plasma source interior volume;
  a first induction coil disposed proximate the first sidewall and disposed around the first sidewall;
  a first radio frequency power generator coupled with the first induction coil;
  a second induction coil disposed proximate the second sidewall and disposed around the second sidewall; and
  a second radio frequency power generator coupled with the second induction coil.

Clause 25. The plasma source of Clause 24, wherein the first induction coil is disposed around the first sidewall, the second induction coil, and the second sidewall.

Clause 26. The plasma source of Clauses 24 or 25, wherein:
  the first sidewall and the gas injection insert define a peripheral interior volume of the plasma source interior volume, and
  the second sidewall and the center gas injection port define a center interior volume of the plasma source interior volume.

Clause 27. The plasma source of any of Clauses 24 to 26, further comprising a separator coupled with a surface of the gas injection insert.

Clause 28. An apparatus comprising:
  a processing chamber;
  the plasma source of any of Clauses 24 to 27; and
  a separation grid disposed within the processing chamber.

Clause 29. The apparatus of any of Clauses 24 to 28, wherein the separation grid comprises aluminum nitride or aluminum oxide.

Clause 30. The apparatus of any of Clauses 24 to 29, wherein the processing chamber comprises a substrate support operable to support a substrate in the processing chamber;
  a plurality of lamps; and
  a dome disposed between the substrate support and the plurality of lamps.

Clause 31. A plasma source, comprising:
  a sidewall and a gas injection insert defining a plasma source interior volume;
  the gas injection insert comprising a peripheral gas injection port and disposed within the plasma source interior volume, the gas injection insert defining a gas injection channel proximate the sidewall;
  a center gas injection port disposed through the gas injection insert to provide an opening at a portion of the gas injection insert; and
  a platform coupled with the gas injection insert and disposed proximate the opening.

Clause 32. The plasma source of Clause 31, wherein the opening is a plurality of holes.

Clause 33. The plasma source of Clauses 31 or 32, wherein the plurality of holes is disposed proximate a gas distribution plenum coupled with the center gas injection port.

Clause 34. An apparatus comprising:
  a processing chamber;
  the plasma source of any of Clauses 31 to 33; and
  a separation grid disposed within the processing chamber.

Clause 35. The apparatus of any of Clauses 31 to 34, wherein the separation grid comprises aluminum nitride or aluminum oxide.

Clause 36. The apparatus of any of Clauses 31 to 35, wherein the processing chamber comprises a substrate support operable to support a substrate in the processing chamber;
  a plurality of lamps; and
  a dome disposed between the substrate support and the plurality of lamps.

Clause 37. The plasma source of any of Clauses 31 to 36, further comprising:
  an induction coil disposed proximate the sidewall and disposed around the sidewall; and
  a radio frequency power generator coupled with the induction coil.

Clause 38. The plasma source of any of Clauses 31 to 37, wherein a surface of the platform is substantially aligned along an axis within about 1 cm to about 2 cm of the axis with a coil loop of the induction coil.

Clause 39. A plasma source, comprising:
  a first sidewall forming a cylinder;
  a gas injection insert disposed within the cylinder and located at an upper end of the first sidewall, the gas injection insert having a second sidewall with a cylindrical shape, the gas injection insert and the first sidewall defining a plasma source interior volume, the gas injection insert comprising:
    a peripheral gas injection port coupled to the first sidewall, the peripheral gas injection port disposed radially outward of the center gas injection port and the second sidewall and disposed radially inward of the first sidewall, the peripheral gas injection port in fluid communication with the plasma source interior volume and having an outlet located at a first vertical position;
    a center gas injection port disposed around the second sidewall and having an outlet located at a second vertical position different than the first vertical position, the center gas injection port in fluid communication with the plasma source interior volume; and
  an induction coil disposed around the first sidewall, wherein the outlet located at the second vertical position is substantially aligned along a vertical center of the induction coil and the outlet located at the first vertical position is unaligned along the vertical center of the induction coil.

Clause 40. The plasma source of Clause 39, wherein the peripheral gas injection port is proximate the center gas injection port and disposed around the center gas injection port.

Clause 41. The plasma source of Clauses 39 or 40, wherein the center gas injection port has a cylindrical shape.

Clause 42. The plasma source of any of Clauses 39 to 41, wherein the center gas injection port has an angled gas outlet.

Clause 43. The plasma source of any of Clauses 39 to 42, wherein the angled gas outlet has an angle of about 30 degrees to about 60 degrees, such as about 45 degrees, relative to a center axis of the center gas injection port.

Clause 44. The plasma source of any of Clauses 39 to 43, wherein the gas injection insert has a movable surface, wherein the gas injection insert further comprises:
  an actuator configured to move the movable surface of the gas injection insert along a direction while a remainder portion of the gas injection insert is static relative to the movable surface.

Clause 45. The plasma source of any of Clauses 39 to 44, further comprising an actuator configured to move the gas injection insert along a direction while a plate is static relative to the gas injection insert.

Clause 46. The plasma source of any of Clauses 39 to 45, wherein the gas injection insert and the plate define a volume that allows movement of the gas injection insert.

Clause 47. The plasma source of any of Clauses 39 to 46, further comprising: a radio frequency power generator coupled with the induction coil.

Clause 48. The plasma source of any of Clauses 39 to 47, wherein a surface of the gas injection insert is substantially aligned along an axis within about 1 cm to about 2 cm of the axis with a coil loop of the induction coil.

Clause 49. An apparatus comprising:
a processing chamber;
the plasma source of any of Clauses 39 to 48; and
a separation grid disposed within the processing chamber.

Clause 50. The apparatus of any of Clauses 39 to 49, wherein the separation grid comprises aluminum nitride or aluminum oxide.

Clause 51. The apparatus of any of Clauses 39 to 50, wherein the processing chamber comprises a substrate support operable to support a substrate in the processing chamber;
a plurality of lamps; and
a dome disposed between the substrate support and the plurality of lamps.

Clause 52. A separation grid comprising:
a metal surface comprising aluminum nitride or aluminum oxide; and
a plurality of holes disposed through the separation grid.

Clause 53. The separation grid of Clause 52, wherein the metal surface further comprises a metal selected from the group consisting of tantalum, tantalum nitride, and combination(s) thereof.

Clause 54. The separation grid of Clauses 52 or 53, wherein the holes of the plurality of holes have an average diameter of about 4 mm to about 6 mm.

Clause 55. The separation grid of any of Clauses 52 to 54, wherein the separation grid has a thickness of about 3 mm to about 5 mm.

Clause 56. The separation grid of any of Clauses 52 to 55, wherein the separation grid has a ratio of thickness of the separation grid to average diameter of the plurality of holes of about 1 to about 3.

Clause 57. A plasma source, comprising:
a first sidewall and a gas injection insert defining a plasma source interior volume, the gas injection insert comprising a peripheral gas injection port;
an induction coil disposed proximate the first sidewall and disposed around the first sidewall; and
a radio frequency power generator coupled with the induction coil, wherein the induction coil is aligned with a plane of a bottom surface of the gas injection insert in such a way that a top portion of the induction coil is above the bottom surface and a bottom portion of the coil is below the bottom surface.

Overall, the present disclosure provides plasma sources and apparatus for providing improved plasma uniformity for processing substrates in addition to efficient delivery of high density neutral plasma species (e.g., unconventional species) to the substrates.

As used herein, the terms "inner" and "outer"; "up" and "down"; "upper" and "lower"; "top" and "bottom", "vertical" and "horizontal", "upward" and "downward"; "above" and "below"; and other like terms as used herein refer to relative positions to one another and are not intended to denote a particular direction or spatial orientation of the overall source/apparatus.

While the foregoing is directed to embodiments of the present disclosure, other and further embodiments of the disclosure may be devised without departing from the basic scope thereof.

What is claimed is:

1. A plasma source, comprising:
a sidewall defining a plasma source interior volume, the sidewall coupled with an edge gas injection port, the edge gas injection port being disposed perpendicular to the sidewall and surrounded by a circular plenum;
a gas injection insert disposed within the plasma source interior volume, the gas injection insert defining a gas injection channel proximate the sidewall;
a first induction coil disposed at a first position adjacent the sidewall and disposed around the sidewall;
a first radio frequency power generator coupled with the first induction coil;
a second induction coil disposed at a second position adjacent the sidewall and disposed around the sidewall, wherein the second position is below the first position and is at a bottom ⅓ height of the plasma source; and
a second radio frequency power generator coupled with the second induction coil.

2. The plasma source of claim 1, wherein the second position is at a bottom ⅕ height of the plasma source.

3. The plasma source of claim 1, wherein:
the first radio frequency power generator is configured to provide a power of about 10 KW to about 20 KW to the first induction coil, and
the second radio frequency power generator is configured to provide a power of about 1 KW to about 6 KW to the second induction coil.

4. The plasma source of any of claim 1, further comprising a magnetic field concentrator disposed around the second induction coil.

5. The plasma source of claim 1, wherein a plane of a bottom surface of the gas injection insert is positioned about 1 cm to about 2 cm from a vertical midpoint of the first induction coil.

6. An apparatus, comprising:
a plasma source, the plasma source comprising:
a sidewall, a peripheral gas injection port, and a plate defining a plasma source interior volume;
a gas injection insert coupled with the plate and disposed within the plasma source interior volume, wherein:
the gas injection insert defines a first gas injection channel adjacent the sidewall,
the gas injection insert comprises a second gas injection channel, the second gas injection channel being radially inward of the first gas injection channel, and
the gas injection insert is coupled to a distribution platform at a distal end of the gas injection insert;
an actuator configured to move the gas injection insert along a direction while the plate is static relative to the gas injection insert.

7. The apparatus of claim 6, further comprising a separation grid, wherein the separation grid comprises aluminum nitride or aluminum oxide.

8. The apparatus of claim 6, further comprising:
an induction coil disposed proximate the sidewall of the plasma source and disposed around the sidewall; and
a radio frequency power generator coupled with the induction coil.

9. The plasma source of claim 6, wherein a plane of a bottom surface of the gas injection insert is positioned about 1 cm to about 2 cm from a vertical midpoint of the first induction coil.

10. An apparatus, comprising:
a sidewall defining a plasma source interior volume;
a gas injection insert disposed within the plasma source interior volume, the gas injection insert defining a gas injection channel adjacent the sidewall;
a first plasma source comprising an induction coil disposed at a first position exterior of and surrounding the sidewall;
a second plasma source disposed within a recess of the gas injection insert; and
a cylindrical protrusion extending from a lower surface of the gas injection insert at a location between the recess and the sidewall.

11. The apparatus of claim 10, wherein the gas injection insert comprises a peripheral gas injection port disposed within the plasma source interior volume, the gas injection insert defining a gas injection channel proximate the sidewall.

12. The apparatus of claim 11, further comprising a centrally located gas injection port located within the gas injection insert, the centrally located gas injection port providing a process gas to a region of the plasma source interior volume.

13. The apparatus of claim 5, further comprising an radio frequency power generator coupled to the first induction coil.

14. The apparatus of claim 13, wherein a plane of a bottom surface of the gas injection insert is positioned about 1 cm to about 2 cm from a vertical midpoint of the first induction coil.

15. The apparatus of claim 14, wherein the radio frequency power generator is configured to provide a power of about 1 kW to about 20 KW to the first induction coil.

16. The apparatus of claim 15, wherein the second plasma source is a second induction coil disposed at a second position radially outward of the recess of the gas injection insert and interior of the first induction coil.

* * * * *

UNITED STATES PATENT AND TRADEMARK OFFICE
CERTIFICATE OF CORRECTION

PATENT NO. : 12,272,521 B2
APPLICATION NO. : 18/199780
DATED : April 8, 2025
INVENTOR(S) : Vladimir Nagorny et al.

It is certified that error appears in the above-identified patent and that said Letters Patent is hereby corrected as shown below:

In the Specification

In Column 4, Line 13, delete "KW" and insert -- kW --.

In Column 4, Line 13, delete "KW," and insert -- kW, --.

In Column 4, Line 13, delete "KW." and insert -- kW. --.

In Column 5, Line 21, delete "(A)" and insert -- (Δ) --.

In Column 7, Line 19, delete "KW" and insert -- kW --.

In Column 7, Line 19, delete "KW," and insert -- kW, --.

In Column 7, Line 20, delete "KW." and insert -- kW. --.

In Column 7, Line 30, delete "KW" and insert -- kW --.

In Column 7, Line 30, delete "KW," and insert -- kW, --.

In Column 7, Line 31, delete "KW" and insert -- kW --.

In Column 7, Line 31, delete "KW." and insert -- kW. --.

In Column 10, Line 10, delete "KW," and insert -- kW, --.

In Column 10, Line 10, delete "KW" and insert -- kW --.

In Column 10, Line 10, delete "KW." and insert -- kW. --.

Signed and Sealed this
Twenty-eighth Day of October, 2025

John A. Squires
*Director of the United States Patent and Trademark Office*

CERTIFICATE OF CORRECTION (continued)
U.S. Pat. No. 12,272,521 B2

In Column 10, Line 20, delete "0.3 KW" and insert -- 0.3 kW --.

In Column 10, Line 20, delete "KW," and insert -- kW, --.

In Column 10, Line 20, delete "0.5 KW" and insert -- 0.5 kW --.

In Column 14, Line 36, delete "KW," and insert -- kW, --.

In Column 14, Line 36, delete "KW" and insert -- kW --.

In Column 14, Line 36, delete "KW." and insert -- kW. --.

In Column 16, Line 34, delete "10 KW" and insert -- 10 kW --.

In Column 16, Line 34, delete "20 KW" and insert -- 20 kW --.

In Column 16, Line 37, delete "KW" and insert -- kW --.

In Column 16, Line 38, delete "KW" and insert -- kW --.

In the Claims

In Column 20, Line 38, in Claim 3, delete "10 KW" and insert -- 10 kW --.

In Column 20, Line 38, in Claim 3, delete "20 KW" and insert -- 20 kW --.

In Column 20, Line 41, in Claim 3, delete "1 KW" and insert -- 1 kW --.

In Column 20, Line 41, in Claim 3, delete "6 KW" and insert -- 6 kW --.

In Column 22, Line 11, in Claim 13, delete "claim 5," and insert -- claim 12, --.

In Column 22, Line 20, in Claim 15, delete "KW" and insert -- kW --.